(12) United States Patent
Lee et al.

(10) Patent No.: US 8,306,175 B2
(45) Date of Patent: Nov. 6, 2012

(54) CLOCK AND DATA RECOVERY CIRCUIT

(75) Inventors: Chao-Cheng Lee, Hsinchu Hsien (TW); Tzu-Chien Tzeng, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 1210 days.

(21) Appl. No.: 11/977,984

(22) Filed: Oct. 26, 2007

(65) Prior Publication Data

US 2008/0101521 A1 May 1, 2008

(30) Foreign Application Priority Data

Oct. 31, 2006 (TW) ............................. 95140191 A

(51) Int. Cl.
*H04L 7/00* (2006.01)
(52) U.S. Cl. .................. 375/373; 375/376; 327/156
(58) Field of Classification Search .............. 375/371, 375/373, 376; 327/147, 148, 156, 158, 536; 455/260, 262, 264, 180.3; 331/17, 16, 34
See application file for complete search history.

(56) References Cited

U.S. PATENT DOCUMENTS

| | | | | |
|---|---|---|---|---|
| 5,135,270 A * | 8/1992 | Arnoldt et al. | ................ | 285/363 |
| 5,400,370 A * | 3/1995 | Guo | ................ | 375/371 |
| 5,727,037 A * | 3/1998 | Maneatis | ................ | 375/376 |
| 6,389,548 B1 * | 5/2002 | Bowles | ................ | 713/500 |
| 6,724,265 B2 * | 4/2004 | Humphreys | ................ | 331/17 |
| 7,173,995 B2 * | 2/2007 | Karlquist | ................ | 375/376 |
| 7,274,229 B1 * | 9/2007 | Humphreys et al. | ................ | 327/156 |
| 7,369,000 B2 * | 5/2008 | Wu et al. | ................ | 331/1 R |
| 2003/0206065 A1 * | 11/2003 | Gomez | ................ | 331/16 |
| 2008/0164918 A1 * | 7/2008 | Stockstad et al. | ................ | 327/157 |

FOREIGN PATENT DOCUMENTS

CN 1 494 212 5/2004

OTHER PUBLICATIONS

M.J Chan, A.Postula, Y.Ding and L.Jozwiak, "A bang-bang PLL employing dynamic gain control for low jitter and fast lock times", University of Queensland and Nanosilicon Pty Ltd, Australia and Eindhoven University, The Netherlands, Jun. 2006.*
Joonsuk Lee and Beomsup Kim, "A low-noise fast-lock phase-locked loop with adaptive bandwidth control", Boston Design Center, IBM, IEEE, Aug. 2000.*

* cited by examiner

*Primary Examiner* — Aristocratis Fotakis
(74) *Attorney, Agent, or Firm* — David N. Lathrop

(57) ABSTRACT

A clock and data recovery circuit includes a voltage controlled oscillator for generating an output clock according to a control voltage signal, a loop filter for outputting the control voltage signal according to a current output, a charge pump unit for outputting the current output according to an error signal, and a controller for determining a run length corresponding to input data based on the output clock from the voltage controlled oscillator. The controller further controls at least one of the voltage controlled oscillator, the loop filter and the charge pump unit according to the run length to dynamically adjust loop bandwidth. A method of adjusting loop bandwidth is also disclosed.

23 Claims, 14 Drawing Sheets

CLOCK AND DATA RECOVERY CIRCUIT

CROSS-REFERENCE TO RELATED APPLICATION

This application claims priority of Taiwanese Application No. 095140191, filed on Oct. 31, 2006.

BACKGROUND OF THE INVENTION

1. Field of the Invention

The invention relates to a clock and data recovery circuit, more particularly to a clock and data recovery circuit and a method of adjusting loop bandwidth of the same.

2. Description of the Related Art

FIG. 1 illustrates a conventional clock and data recovery circuit that includes: a voltage controlled oscillator 11 for generating an output clock according a control voltage signal; a loop filter 17 connected electrically to the voltage controlled oscillator 11 for outputting the control voltage signal according to a current output that is composed of first and second current outputs; a first charge pump 14 connected electrically to the loop filter 17 for outputting the first current output according to a frequency error signal; a second charge pump 16 connected electrically to the loop filter 17 for outputting the second current output according to a phase error signal; a frequency divider 12 connected electrically to the voltage controlled oscillator 11 for frequency dividing the output clock; a frequency detector 13 connected electrically to the first charge pump 14 and the frequency divider 12 for comparing the output clock frequency-divided by the frequency divider 12 with a reference signal and for outputting the frequency error signal according to a frequency difference therebetween; a phase detector 15 connected electrically to the voltage controlled oscillator 11 and the second charge pump 16 for comparing the output clock from the voltage controlled oscillator 11 with input data and for outputting the phase error signal according to a phase difference therebetween; and a sampling circuit 18 connected electrically to the voltage controlled oscillator 11 for sampling the input data based on the output clock from the voltage controlled oscillator 11 and for outputting output data.

To ensure stability of the conventional clock and data recovery circuit, it is desirable that loop bandwidth ($F_{PLL,-3dB}$) of a phase-locked loop part thereof be not greater than $\frac{1}{10}$ of the frequency ($F_{in}$) of the input data, which can be expressed as follows:

$$F_{PLL,-3dB} \approx \frac{I_{P2} \cdot R_{LF} \cdot K_{VCO}}{2\pi} \leq \frac{1}{10} F_{in}$$

where $I_{P2}$ is the value of the second current output from the second charge pump 16, $R_{LF}$ is the impedance of the loop filter 17, and $K_{VCO}$ is the gain of the voltage controlled oscillator 11.

The frequency of the input data may change. As such, if the loop bandwidth ($F_{PLL,-3dB}$) is set to $\frac{1}{10}$ of the highest frequency ($F_{in}$) of the input data, jitter of the output clock becomes large when the frequency of the input data becomes low. On the other hand, if the loop bandwidth ($F_{PLL,-3dB}$) is set to $\frac{1}{10}$ of the lowest frequency ($F_{in}$) of the input data, the tracking speed of the phase-locked loop part becomes slow when the frequency ($F_{in}$) of the input data becomes high, thereby resulting in longer settling time of the conventional clock and data recovery circuit.

In view of the above configuration, since the loop bandwidth ($F_{PLL,-3dB}$) is fixed, there is a trade-off between short settling time for conventional clock and data recovery circuit and small jitter for the output clock.

SUMMARY OF THE INVENTION

Therefore, the object of the present invention is to provide a clock and data recovery circuit capable of dynamically adjusting loop bandwidth thereof, and a method of adjusting loop bandwidth of the same.

According to one aspect of the present invention, a clock and data recovery circuit comprises:

a voltage controlled oscillator for generating an output clock according to a control voltage signal;

a loop filter connected electrically to the voltage controlled oscillator for outputting the control voltage signal according to a current output;

a charge pump unit connected electrically to the loop filter for outputting the current output according to an error signal; and a controller connected electrically to the voltage controlled oscillator for determining a run length corresponding to input data based on the output clock from the voltage controlled oscillator, the controller further controlling at least one of the voltage controlled oscillator, the loop filter and the charge pump unit according to the run length to dynamically adjust loop bandwidth.

According to another aspect of the present invention, there is provided a method of adjusting loop bandwidth of a clock and data recovery circuit. The clock and data recovery circuit receives input data and outputs output data corresponding to the input data in response to an output clock generated thereby. The clock and data recovery circuit includes a voltage controlled oscillator, a loop filter, and a charge pump unit. The method comprises the steps of:

determining a run length of the input data; and controlling at least one of the voltage controlled oscillator, the loop filter and the charge pump unit according to the run length to dynamically adjust the loop bandwidth.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
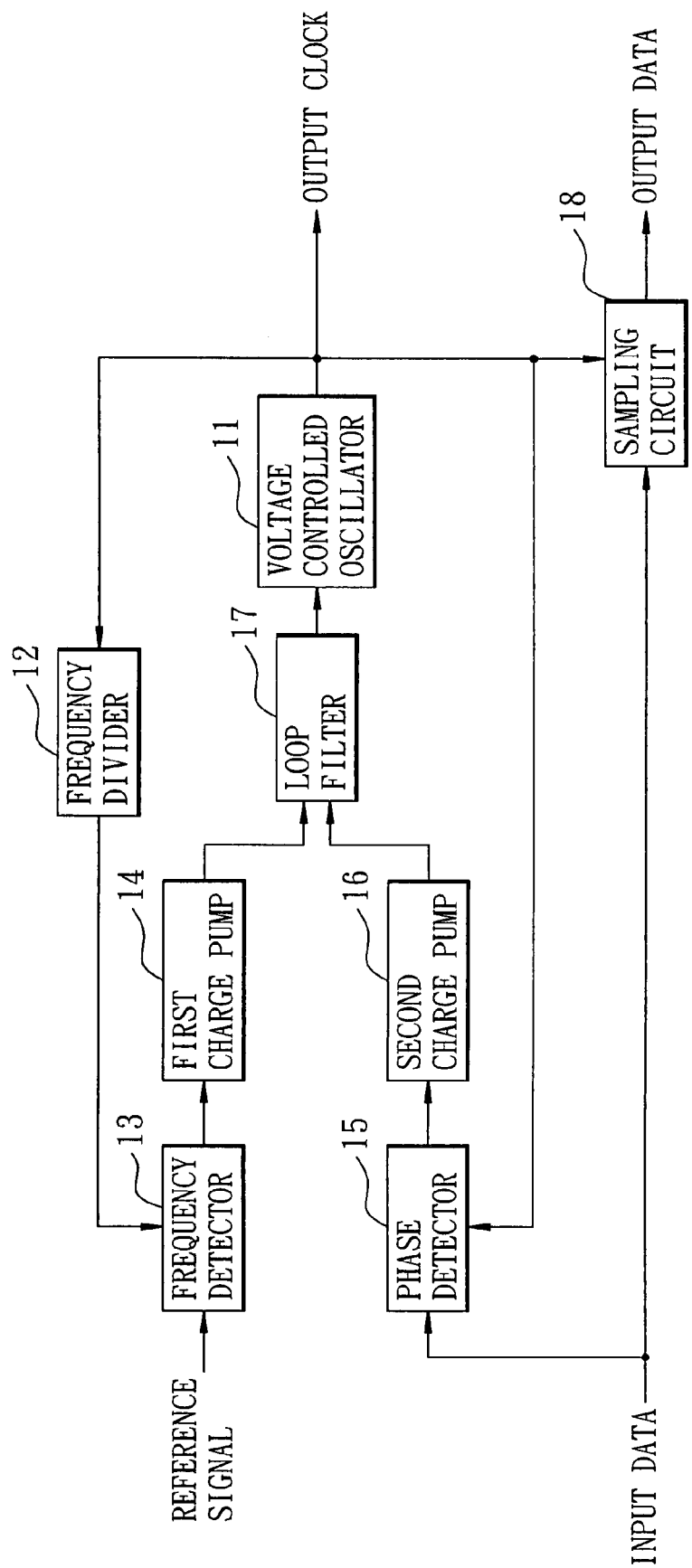
FIG. 1 is a schematic circuit block diagram showing a conventional clock and data recovery circuit.

Before the present invention is described in greater detail, it should be noted that like elements are denoted by the same reference numerals throughout the disclosure.

Figure 2:
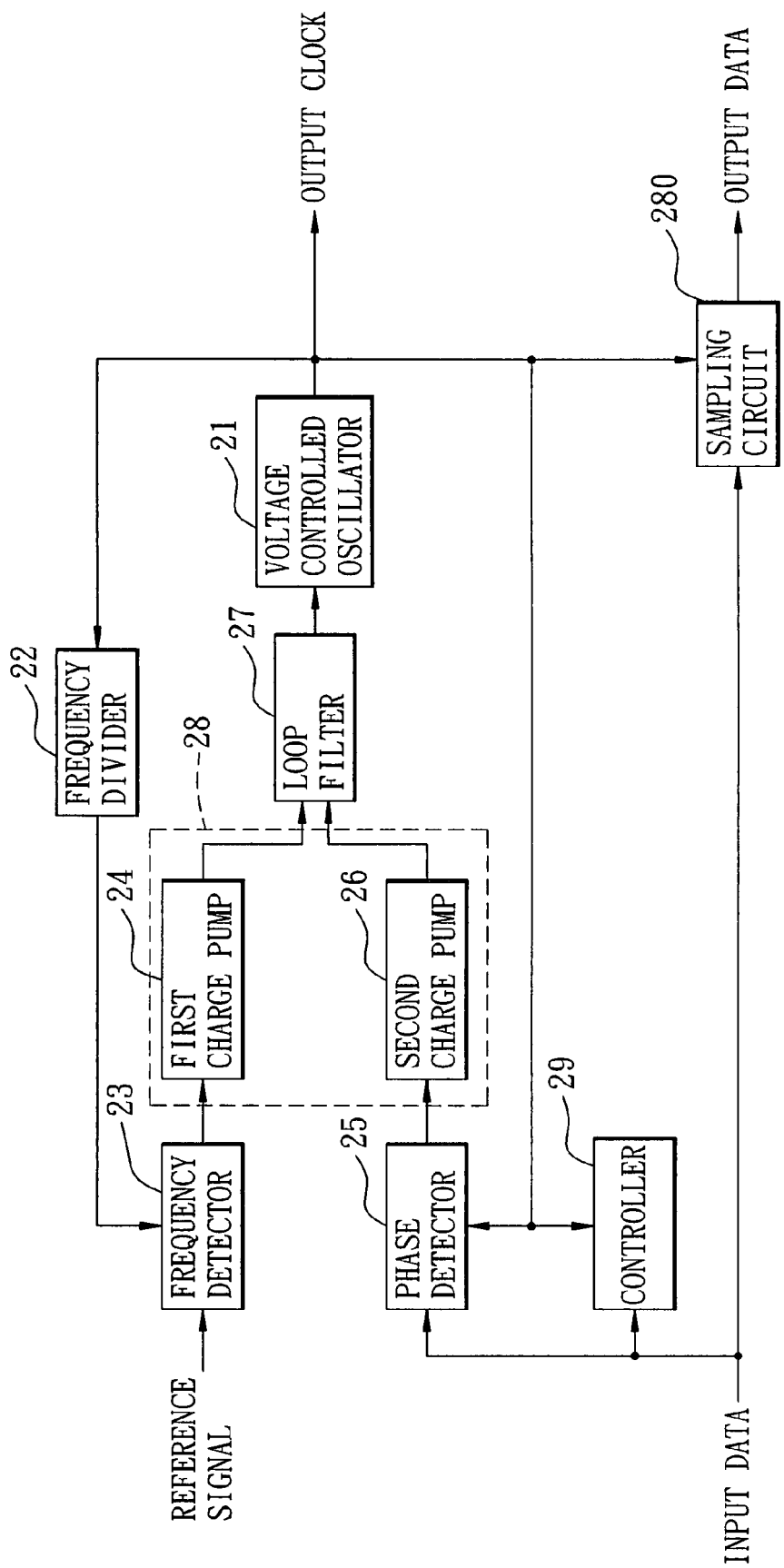
FIG. 2 is a schematic circuit block diagram showing the first preferred embodiment of a clock and data recovery circuit according to the present invention.

Referring to FIG. 2, the first preferred embodiment of a clock and data recovery circuit according to the present invention is shown to include a voltage controlled oscillator 21, a frequency divider 22, a charge pump unit 28, a loop filter 27, a sampling circuit 280, and a controller 29.

The voltage controlled oscillator 21 generates an output clock according to a control voltage signal.

The frequency divider 22 is connected electrically to the voltage controlled oscillator 21 for frequency dividing the output clock generated by the voltage controlled oscillator 21.

The loop filter 27 is connected electrically to the voltage controlled oscillator 21 for outputting the control voltage signal according to a current output.

The charge pump unit 28 is connected electrically to the loop filter 27 for outputting the current output according to an error signal. In this embodiment, the charge pump unit 28 includes a first charge pump 24 for outputting a first current output according to a frequency error signal, and a second charge pump 26 for outputting a second current output according to a phase error signal, wherein the first and second current outputs constitute the current output.

In this embodiment, the clock and data recovery circuit further includes a frequency detector 23 and a phase detector 25. The frequency detector 23 is connected electrically to the frequency divider 22 and the first charge pump 24 of the charge pump unit 28 for comparing the output clock frequency divided by the frequency divider 22 with a reference signal and for outputting the frequency error signal according to a frequency difference therebetween. The phase detector 25 is connected electrically to the second charge pump 26 of the charge pump unit 28 and the voltage controlled oscillator 21 for comparing the output clock from the voltage controlled oscillator 21 with input data and for outputting the phase error signal according to a phase difference therebetween. The frequency error signal and the phase error signal constitute the error signal.

The controller 29 is connected electrically to the voltage controlled oscillator 21 for determining a run length corresponding to the input data based on the output clock from the voltage controlled oscillator 21.

The sampling circuit 280 is connected electrically to the voltage controlled oscillator 21 for sampling the input data based on the output clock from the voltage controlled oscillator 21 and for outputting output data.

In this embodiment, the clock and data recovery circuit can be divided into a frequency-locked loop part, which consists of the frequency detector 23, the first charge pump 24, the loop filter 27, the voltage controlled oscillator 21 and the frequency divider 22, and a phase-locked loop part, which consists of the phase detector 25, the second charge pump 26, the loop filter 27 and the voltage controlled oscillator 21.

The frequency-locked loop part is operated so that the frequency of the output clock generated by the voltage controlled oscillator 21 is close to a highest frequency of the input data. Then, the phase-locked loop part is operated so that the frequency of the output clock generated by the voltage controlled oscillator 21 is the same as the highest frequency of the input data.

It is noted that the controller 29 further controls at least one of the voltage controlled oscillator 21, the loop filter 27 and the second charge pump 26 of the charge pump unit 28 according to the run length to dynamically adjust loop bandwidth. In this embodiment, there are provided first and second embodiments of the controller 29.

Figure 3:
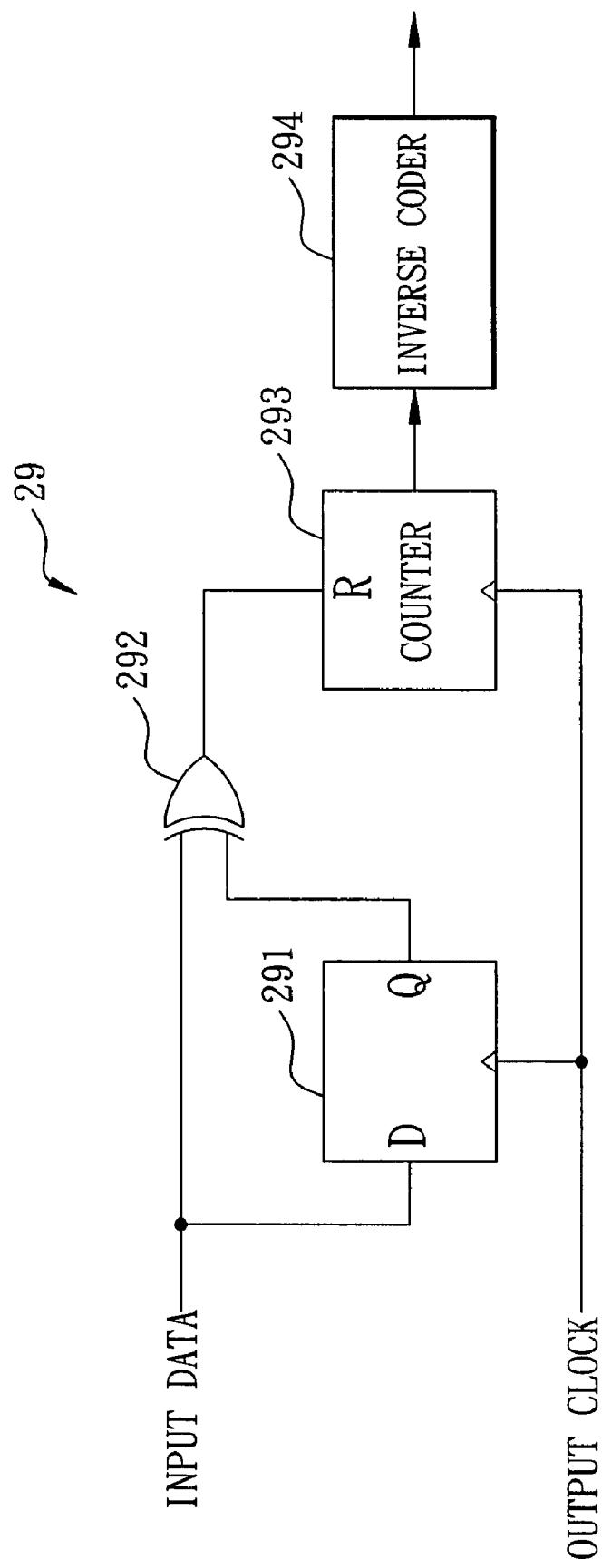
FIG. 3 is a schematic electrical circuit diagram showing a first embodiment of a controller of the first preferred embodiment.

Referring to FIG. 3, the first embodiment of the controller 29 is shown to include a D-type flip flop 291, an XOR gate 292, a counter 293, and an inverse coder 294. The D-type flip flop 291 has a clock input end for receiving the output clock from the voltage controlled oscillator 21, a data input end for receiving the input data, and a data output end. The XOR gate 292 has a first input end connected electrically to the data output end of the D-type flip flop 291, a second input end for receiving the input data, and an output end. The D-type flip flop 291 and the XOR gate 292 cooperate to detect whether the input data changes (i.e., a 0 to 1 logic transition or a 1 to 0 logic transition). As such, the XOR gate 292 outputs a reset control signal at the output end thereof when the input data changes. The counter 293 has a reset input end connected electrically to the output end of the XOR gate 292, a clock input end for receiving the output clock from the voltage controlled oscillator 21, and an output end for outputting the run length in the form of a binary code by triggering of the output clock from the voltage controlled oscillator 21. The counter 293 is reset upon receiving the reset control signal at the reset input end, i.e., when the input data changes. The inverse coder 294 is connected electrically to the output end of the counter 293 for encoding the run length into a control signal that has a frequency proportional to that of the input data.

Figure 4:
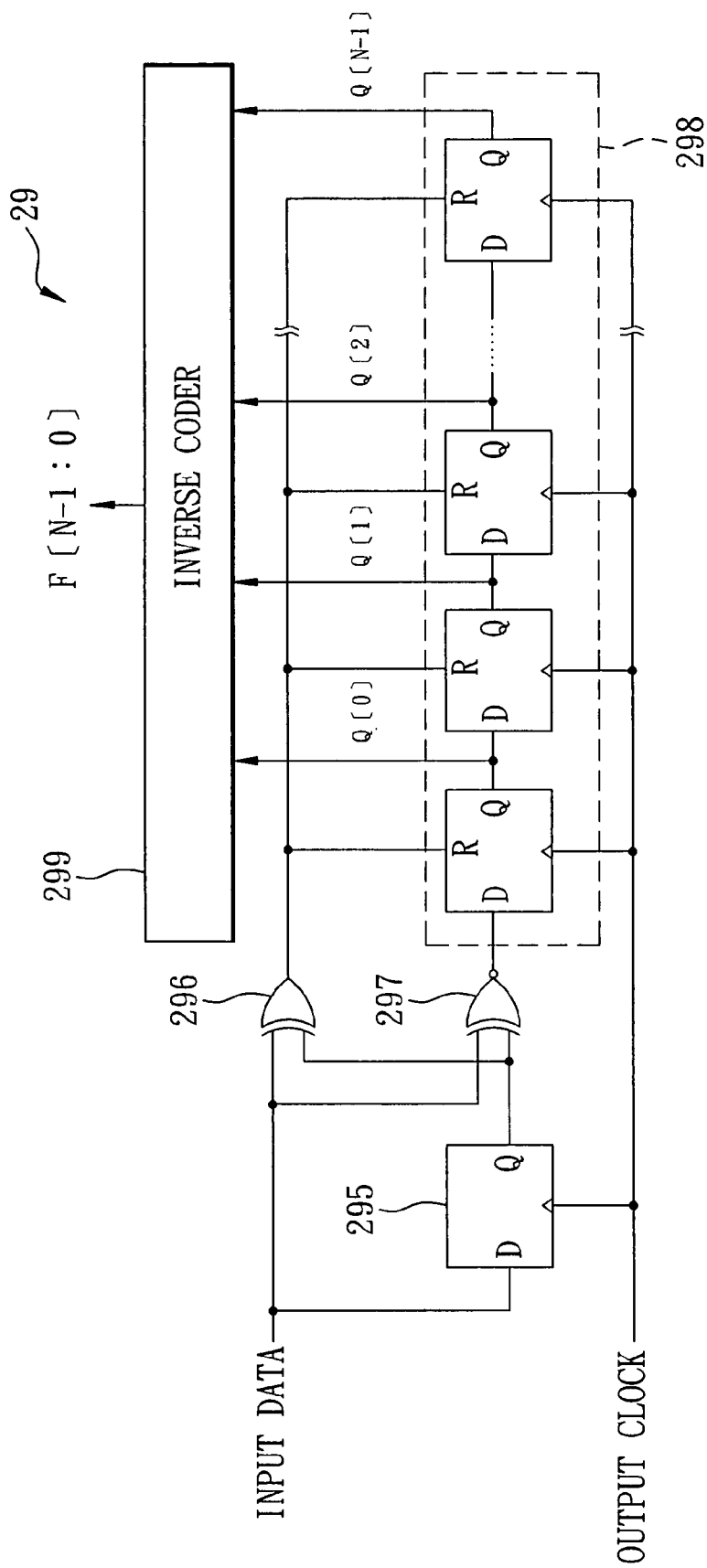
FIG. 4 is a schematic electrical circuit diagram showing a second embodiment of the controller of the first preferred embodiment.

Referring to FIG. 4, the second embodiment of the controller 29 is shown to include a D-type flip flop 295, an XOR gate 296, an XNOR gate 297, an N-stage shift register unit 298, and an inverse coder 299. N is a maximum value of the run length. The D-type flip flop 295 has a clock input end for receiving the output clock from the voltage controlled oscillator 21, a data input end for receiving the input data, and a data output end. The XOR gate 296 has a first input end connected electrically to the data output end of the D-type flip flop 295, a second input end for receiving the input data, and an output end. The D-type flip flop 295 and the XOR gate 296 cooperate to detect whether the input data changes (i.e., a 0 to 1 logic transition or a 1 to 0 logic transition). As such, the XOR gate 296 outputs a reset control signal at the output end thereof when the input data changes. The XNOR gate 297 has a first input end for receiving the input data, a second input end connected electrically to the data output end of the D-type flip flop 295, and an output end. The D-type flip flop 295 and the XNOR gate 297 cooperate to detect whether a current bit of the input data is the same as a previous bit of the input data. As such, the XNOR gate 297 outputs at the output end thereof "1" when the current and previous bits of the input data are the same, and "0" when the current and previous bits of the input data are different. The shift register unit 298 is connected electrically to the output ends of the XOR gate 296 and the XNOR gate 297 for outputting an output Q[N−1:0] in the form of a thermometer code by triggering the output clock from the voltage controlled oscillator 21, wherein the number of "1"s in the output Q[N−1:0] represents the run length of the input data. The shift register unit 298 is reset upon receiving the reset control signal from the output end of the XOR gate 296, i.e., when the input data changes. The inverse coder 299 is connected electrically to the shift register unit 298 for encoding the output Q[N−1:0] into a control signal in the form of F[N−1:0] that has a frequency proportional to that of the input data, i.e., the number of "1"s in F[N−1:0] is proportional to the frequency of the input data.

Under the configuration of the controller 29 shown in FIG. 4, in this embodiment, there are provided three embodiments of the second charge pump 26 of the charge pump unit 28.

Figure 5:
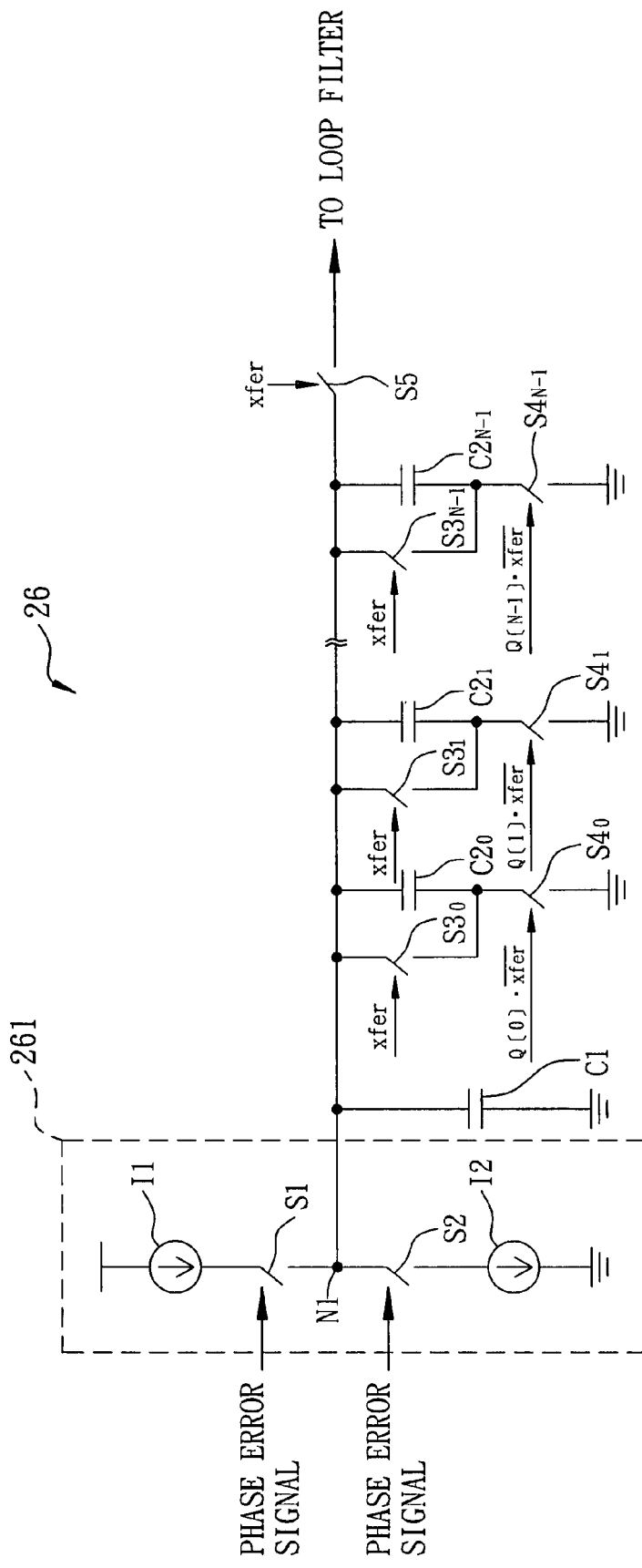
FIG. 5 is a schematic electrical circuit diagram showing a first embodiment of a second charge pump of the first preferred embodiment.

Referring to FIG. 5, a first embodiment of the second charge pump 26 is shown to include a current source unit 261, N third switches ($S3_0$~$S3_{N-1}$), N fourth switches ($S4_0$~$S4_{N-1}$), a fifth switch (S5), a first capacitor (C1), and N second capacitors ($C2_0$~$C2_{N-1}$). The current source unit 261 includes a series connection of a first current source (I1), a first switch (S1), a second current source (S2) and a second switch (S2). Capacitances of the first capacitor (C1) and the second capacitors ($C2_0$~$C2_{N-1}$) may be identical. A node (N1) between the first and second switches (S1, S2) is connected electrically to a first end of each of the third switches ($S3_0$~$S3_{N-1}$) and the fifth switch (S5), and a first terminal of each of the first capacitor (C1) and the second capacitors ($C2_0$~$C2_{N-1}$). Each of the fourth switches ($S4_0$~$S4_{N-1}$) has a first end connected electrically to a second end of a corresponding one of the third switches ($S3_0$~$S3_{N-1}$) and a second terminal of a corresponding one of the second capacitors ($C2_0$~$C2_{N-1}$), and a grounded second end. The fifth switch (S5) has a second end connected electrically to the loop filter 27.

In the current source unit 261, it is assumed that the first and second current sources (I1, I2) supply the same amount of current, and the switching operation of the first and second switches (S1, S2) is controlled by the phase error signal from the phase detector 25.

When one of the first and second switches (S1, S2) is turned on, if the third switches ($S3_0$~$S3_{N-1}$) and the fifth switch (S5) are controlled by a control signal (xfer) to turn off, the switching operation of the fourth switches ($S4_0$~$S4_{N-1}$) is controlled respectively by the output Q[N−1:0], i.e., Q[0]~Q[N−1], such that the number of the second capacitors ($C2_0$~$C2_{N-1}$) connected in parallel between the current source unit 261 and the loop filter 27 corresponds to the run length due to turn-on control of corresponding ones of the fourth switches ($S4_0$~$S4_{N-1}$) by the output Q[0]~Q[N−1] from the controller 29, wherein the greater the run length, the larger will be the number of the second capacitors ($C2_0$~$C2_{N-1}$) connected in parallel to the first capacitor (C1). More specifically, when the first and second switches (S1, S2) are respectively turned on and off, the first capacitor (C1) and the second capacitors ($C2_0$~$C2_{N-1}$) connected in parallel to the first capacitor (C1) are charged by the current from the first current source (I1), whereas when the first and second switches (S1, S2) are respectively turned off and on, the first capacitor (C1) and the second capacitors ($C2_0$~$C2_{N-1}$) connected in parallel to the first capacitor (C1) are discharged via the second current source (I2).

On the other hand, when the first and second switches (S1, S2) are turned off, if the third switches ($S3_0$~$S3_{N-1}$) and the fifth switch (S5) are controlled by the control signal (xfer) to turn on, the fourth switches ($S4_0$~$S4_{N-1}$) are turned off such that the first capacitor (C1) can be incorporated into the loop filter 27.

The greater the run length, the less will be the amount of charge charged on or discharged from the first capacitor (C1) due to charge sharing such that the second current output from the second charge pump 26 is obtained by dividing the current supplied by one of the first and second current sources (I1, I2) by the run length. Therefore, the second current output from the second charge pump 26 is proportional to the frequency of the input data, thereby dynamically adjusting the loop bandwidth with change in the frequency of the input data.

Figure 6:
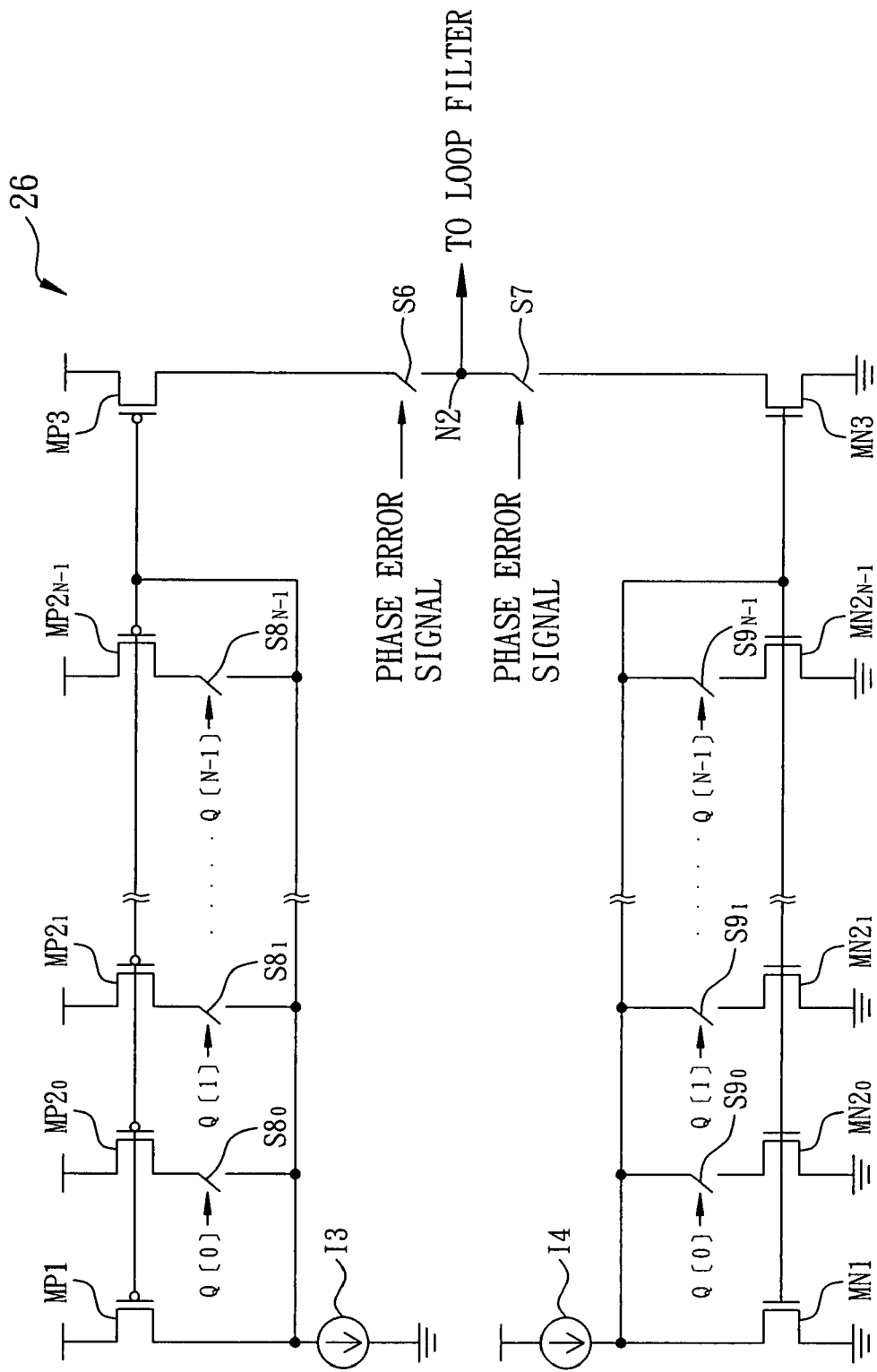
FIG. 6 is a schematic electrical circuit diagram showing a second embodiment of the second charge pump of the first preferred embodiment.

Referring to FIG. 6, a second embodiment of the second charge pump 26 is shown to include third and fourth current sources (I3, I4), a first current mirror circuit composed of a first PMOS transistor (MP1), N second PMOS transistors ($MP2_0$~$MP2_{N-1}$), N eighth switches ($S8_0$~$S8_{N-1}$) and a third PMOS transistor (MP3), a second current mirror circuit composed of a first NMOS transistor (MN1), N second NMOS transistors ($MN2_0$~$MN2_{N-1}$), N ninth switches ($S9_0$~$S9_{N-1}$) and a third NMOS transistor (MN3), and sixth and seventh switches (S6, S7). The PMOS transistors (MP1, MP3), ($MP2_0$~$MP2_{N-1}$) may have the same size, and the NMOS transistors (MN1, MN3), ($MN2_0$~$MN2_{N-1}$) may have the same size. Sources of the PMOS transistors (MP1, MP3), ($MP2_0$~$MP2_{N-1}$) are adapted to be connected electrically to a voltage source (not shown). Gates of the PMOS transistors (MP1, MP3), ($MP2_0$~$MP2_{N-1}$), a drain of the first PMOS transistor (MP1) and first ends of the eighth switches ($S8_0$~$S8_{N-1}$) are connected electrically to the third current source (I3). Drains of the second PMOS transistors ($MP2_0$~$MP2_{N-1}$) are connected electrically and respectively to second ends of the eighth switches ($S8_0$~$S8_{N-1}$). A drain of the third PMOS transistor (MP3) is connected electrically to a first end of the sixth switch (S6). Sources of the NMOS transistors (MN1, MNP3), ($MN2_0$~$MN2_{N-1}$) are grounded. Gates of the NMOS transistors (MN1, MN3), ($MN2_0$~$MN2_{N-1}$), a drain of the first NMOS transistor (MN1) and first ends of the ninth switches ($S9_0$~$S9_{N-1}$) are connected electrically to the fourth current source (I4). Drains of the second NMOS transistors ($MN2_0$~$MN2_{N-1}$) are connected electrically and respectively to second ends of the ninth switches ($S9_0$~$S9_{N-1}$). A drain of the third NMOS transistor (MN3) is connected electrically to a first end of the seventh switch (S7). Second ends of the sixth and seventh switches (S6, S7) are connected electrically to a node (N2) coupled to the loop filter 27. The second charge pump 26 outputs the second current output at the node (N2).

It is assumed that the third and fourth current sources (I3, I4) supply the same amount of current. The switching operation of the sixth and seventh switches (S6, S7) is controlled by the phase error signal from the phase detector 25. It is noted that the switching operation of the eighth and ninth switches ($S8_0$~$S8_{N-1}$), ($S9_0$~$S9_{N-1}$) is controlled by the output Q[0]~Q[N−1] from the controller 29 such that the greater the run length, the greater will be the number of the second PMOS transistors ($MP2_0$~$MP2_{N-1}$) connected in parallel to the first PMOS transistor (MP1), thereby resulting in a smaller current output from the drain of the third PMOS transistor (MP3), and the greater will be the number of the second NMOS transistors ($MN2_0$~$MNP2_{N-1}$) connected in parallel to the first NMOS transistor (MN1), thereby resulting in a smaller current output from the drain of the third NMOS transistor (MN3). As a result, the second current output outputted by the second charge pump 26 is either a current part obtained by dividing the current from the third current source (I3) by the run length or a current part obtained by dividing the current from the fourth current source (I4) by the run length. Therefore, the second current output from the second charge pump 26 is proportional to the frequency of the input data, thereby dynamically adjusting the loop bandwidth with change in the frequency of the input data.

Figure 7:
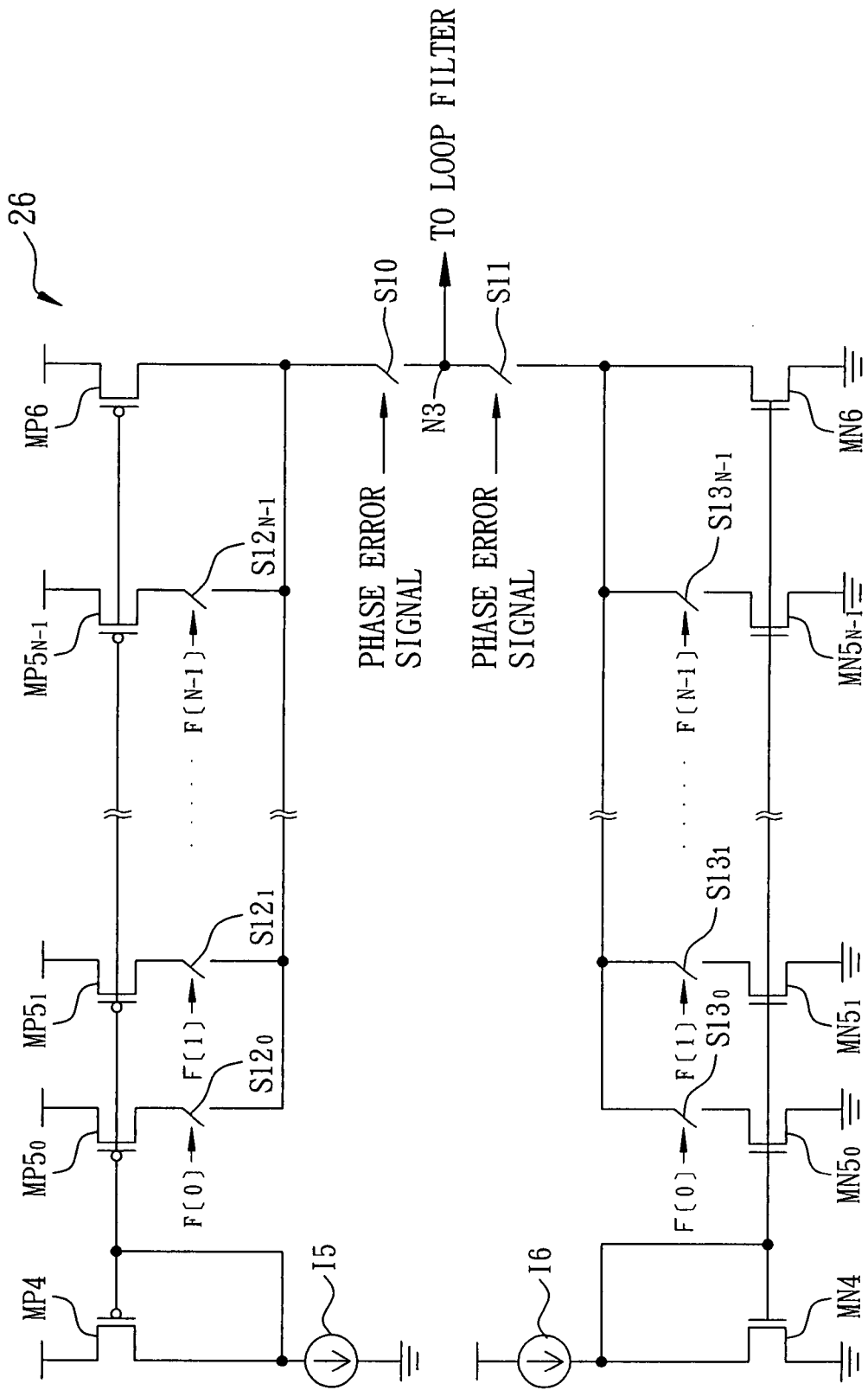
FIG. 7 is a schematic electrical circuit diagram showing a third embodiment of the second charge pump of the first preferred embodiment.

Referring to FIG. 7, a third embodiment of the second charge pump 26 is shown to include fifth and sixth current sources (I5, I6), a first current mirror circuit composed of a fourth PMOS transistor (MP4), N fifth PMOS transistors (MP5$_0$~MP5$_{N-1}$), a sixth PMOS transistor (MP6) and N twelfth switches (S12$_0$~S12$_{N-1}$), a second current mirror circuit composed of a fourth NMOS transistor (MN4) N fifth NMOS transistors (MN5$_0$~MN5$_{N-1}$), a sixth NMOS transistor (MN6) and N thirteenth switches (S13$_0$~S13$_{N-1}$) and tenth and eleventh switches (S10, S11). The PMOS transistors (MP4, MP6), (MP5$_0$~MP5$_{N-1}$) may have the same size, and the NMOS transistors (MN4, MN6), (MN5$_0$~MN5$_{N-1}$) may have the same size. Sources of the PMOS transistors (MP4, MP6), (MP5$_0$~MP5$_{N-1}$) are adapted to be connected electrically to a voltage source (not shown). Gates of the PMOS transistors (MP4, MP6), (MP5$_0$~MP5$_{N-1}$) and a drain of the fourth PMOS transistor (MP4) are connected electrically to the third current source (I3). Drains of the fifth PMOS transistors (MP5$_0$~MP5$_{N-1}$) are connected electrically and respectively to first ends of the twelfth switches (S12$_0$~S12$_{N-1}$). Second ends of the twelfth switches (S12$_0$~S12$_{N-1}$) and a drain of the sixth PMOS transistor (MP6) are connected electrically to a first end of the tenth switch (S10). Sources of the NMOS transistors (MN4, MN6), (MN5$_0$~MN5$_{N-1}$) are grounded. Gates of the NMOS transistors (MN4, MN6), (MN52$_0$~MN5$_{N-1}$), a drain of the fourth NMOS transistor (MN4) are connected electrically to the sixth current source (I6). Drains of the fifth NMOS transistors (MN5$_0$~MN5$_{N-1}$) are connected electrically and respectively to first ends of the thirteenth switches (S13$_0$~S13$_{N-1}$). Second ends of the thirteenth switches (S13$_0$~S13$_{N-1}$) and a drain of the sixth NMOS transistor (MN6) are connected electrically to a first end of the eleventh switch (S11). Second ends of the tenth and eleventh switches (S10, S12) are connected electrically to a node (N3) coupled to the loop filter 27. The second charge pump 26 outputs the second current output at the node (N3).

It is assumed that the fifth and sixth current sources (I5, I6) supply the same amount of current. The switching operation of the tenth and eleventh switches (S10, S11) is controlled by the phase error signal from the phase detector 25. It is noted that the switching operation of the twelfth and thirteenth switches (S12$_0$~S12$_{N-1}$), (S13$_0$~S13$_{N-1}$) is controlled by the control signal F[0]~F[N-1] from the controller 29 such that the higher the frequency of the input data, the greater will be the number of the fifth PMOS transistors (MP5$_0$~MP5$_{N-1}$) connected in parallel to the sixth PMOS transistor (MP6), thereby resulting in the larger current output to the node (N3), and the greater will be the number of the fifth NMOS transistors (MN5$_0$~MN52$_{N-1}$) connected in parallel to the sixth NMOS transistor (MN6), thereby resulting in the larger current output to the node (N3). As a result, the second current output outputted by the second charge pump 26 is either a current part obtained by dividing the current from the fifth current source (I5) by the run length or a current part obtained by dividing the current from the sixth current source (I6) by the run length. Therefore, the second current output from the second charge pump 26 is proportional to the frequency of the input data, thereby dynamically adjusting the loop bandwidth with change in the frequency of the input data.

Figure 8:
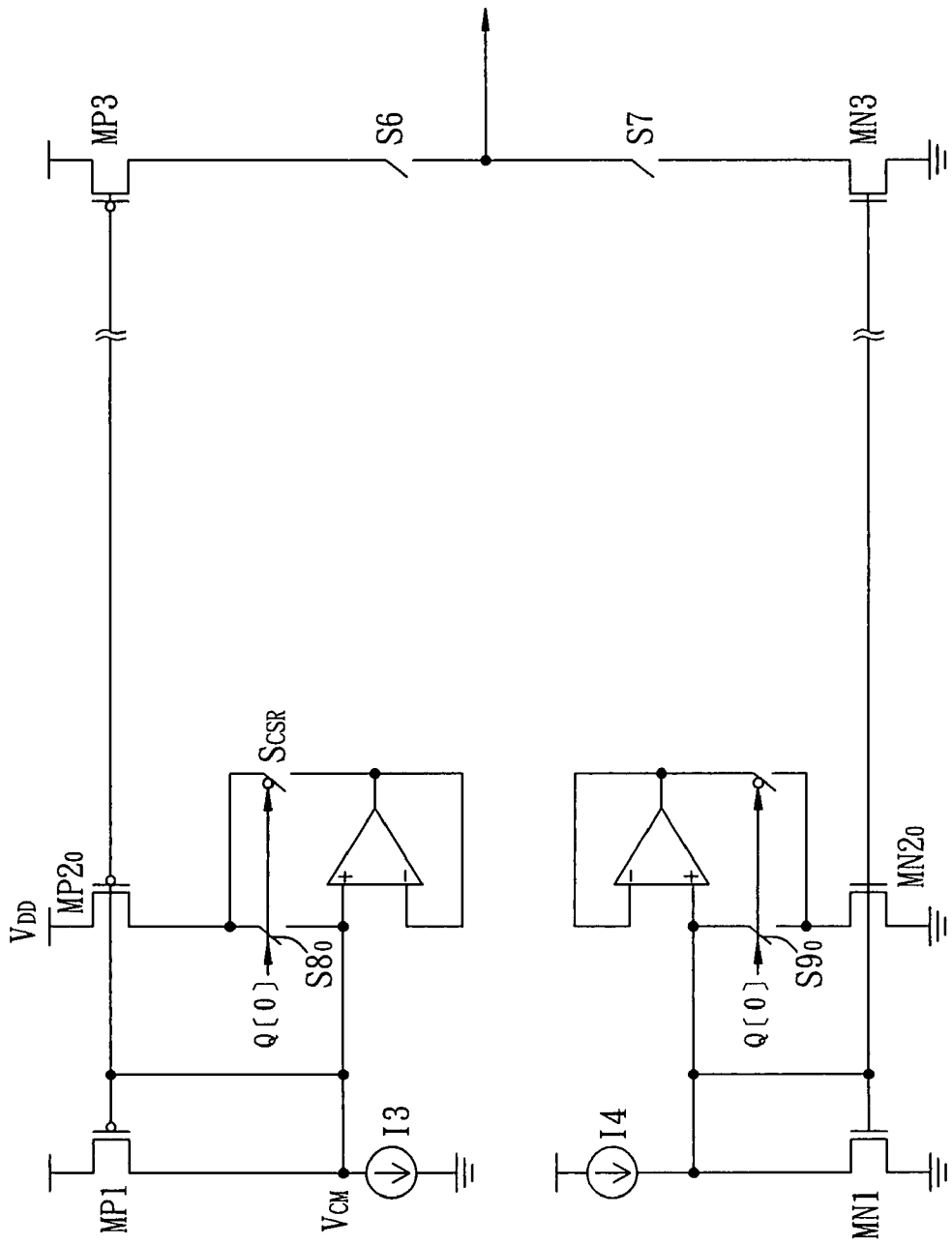
FIG. 8 is a schematic electrical circuit diagram showing charge sharing removal circuits added to the second embodiment of the second charge pump of FIG. 6.

In the first embodiment of the second charge pump 26, the second current output outputted by the second charge pump 26 is changed based on the number of the second capacitors (C2$_0$~C2$_{N-1}$) connected in parallel to the first capacitor (C1). In the second and third embodiments of the second charge pump 26, the second current output outputted by the second charge pump 26 is changed based on the number of the transistors connected in parallel in each of the first and second current mirror circuits. It is noted that, in the second and third embodiments of the second charge pump 26, a charge sharing removal circuit composed of a switch (SCSR) and an operational amplifier (OP) (see FIG. 8) can be connected across each of the switches (S8$_0$~S8$_{N-1}$), (S9$_0$~S9$_{N-1}$), (S12$_0$~S12$_{N-1}$), (S13$_0$~S13$_{N-1}$) to stabilize the control voltage signal outputted by the loop filter 27.

Figure 9:
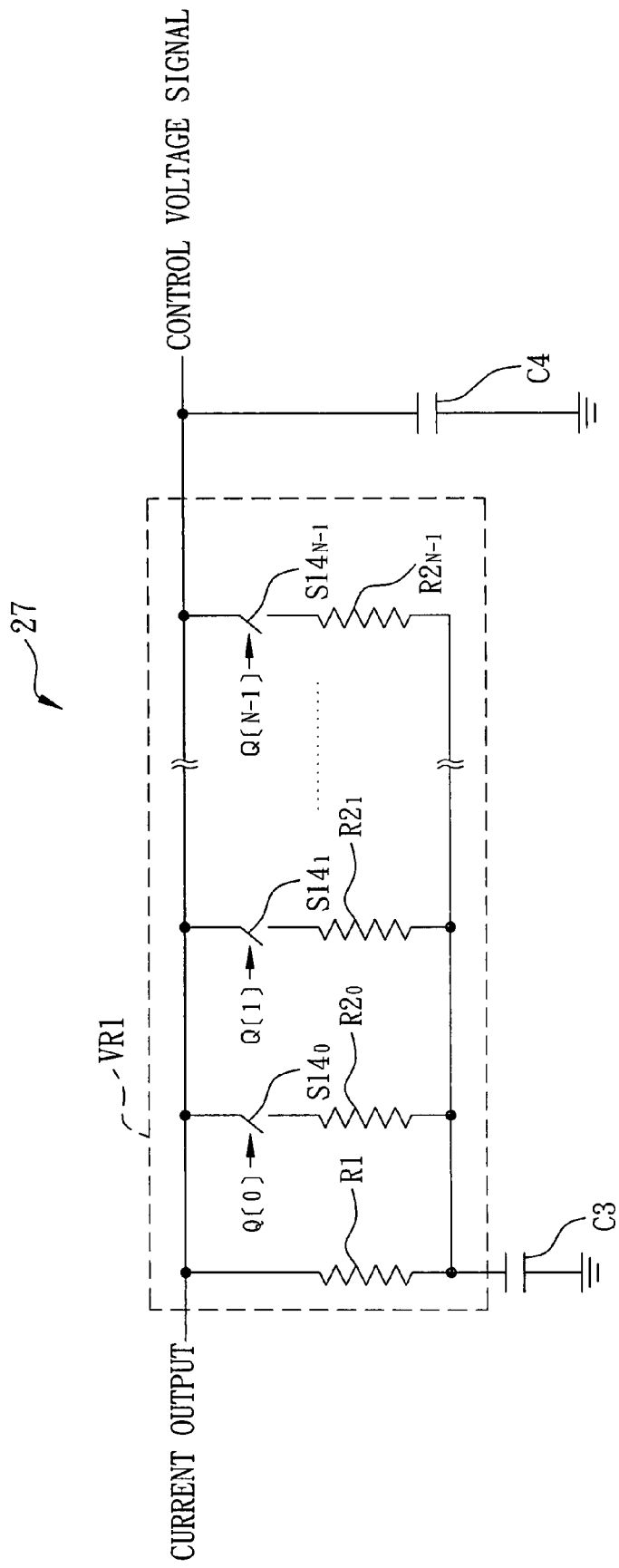
FIG. 9 is a schematic electrical circuit diagram showing a loop filter of the first preferred embodiment.

Under the configuration of the controller 29 shown in FIG. 4, in this embodiment, referring to FIG. 9, the loop filter 27 is shown to include a first variable resistor unit (VR1), and third and fourth capacitors (C3, C4). The first variable resistor unit (VR1) includes a first resistor (R1), N second resistors (R2$_0$~R2$_{N-1}$) and N fourteenth switches (S14$_0$~S4$_{N-1}$). One end of the first resistor (R1), first ends of the fourteenth switches (S14$_0$~S14$_{N-1}$) and a first terminal of the fourth capacitor (C4) are connected electrically to the charge pump unit 28 and the voltage controlled oscillator 21 for receiving the current output from the charge pump unit 28 and for outputting the control voltage signal to the voltage controlled oscillator 21. A second end of each of the fourteenth switches (S14$_0$~S14$_{N-1}$) is connected electrically to one end of a corresponding one of the second resistors (R2$_0$~R2$_{N-1}$) The other ends of the first resistor (R1) and the second resistors (R2$_0$~R2$_{N-1}$) are connected electrically to a first terminal of the third capacitor (C3). Each of the third and fourth capacitors (C3, C4) has a grounded second end. The resistors (R1), (R2$_0$~R2$_{N-1}$) may have the same resistance.

The switching operation of the fourteenth switches (S14$_0$~S14$_{N-1}$) is controlled by the output Q[0]~Q[N-1] from the controller 29 such that the greater the run length, the greater will be the number of the second resistors (R2$_0$~R2$_{N-1}$) connected in parallel to the first resistor (R1), thereby resulting in a smaller resistance of the first variable resistor unit (VR1). Therefore, the resistance of the first variable resistor unit (VR1) is proportional to the frequency of the input data, thereby dynamically adjusting the loop bandwidth with change in the frequency of the input data.

Under the configuration of the controller 29 shown in FIG. 4, in this embodiment, there are provided three embodiments of the voltage controlled oscillator 21.

Figure 10:
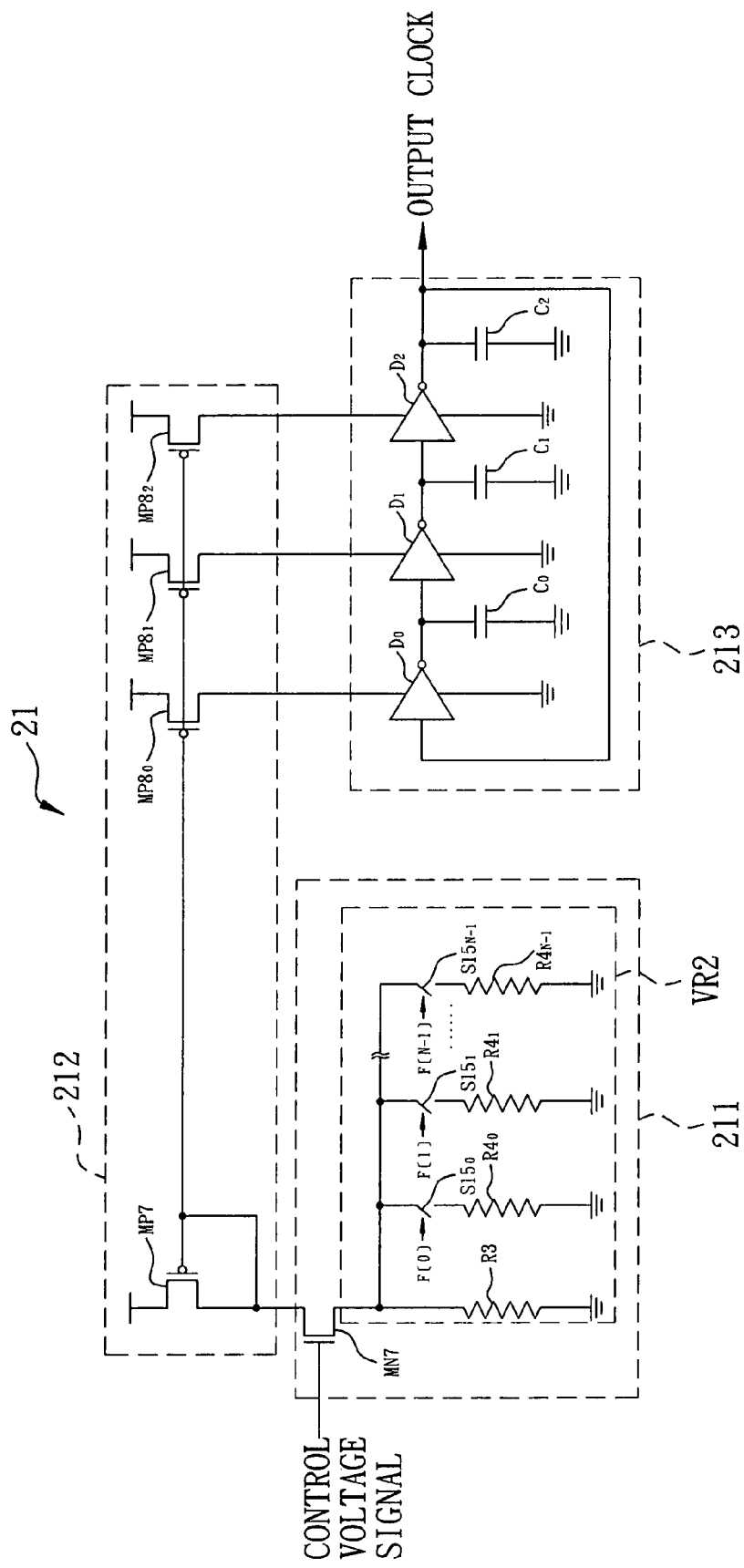
FIG. 10 is a schematic electrical circuit diagram showing a first embodiment of a voltage controlled oscillator of the first preferred embodiment.

Referring to FIG. 10, a first embodiment of the voltage controlled oscillator 21 is shown to include a voltage-to-current converting unit 211 for converting the control voltage signal from the loop filter 27 into a current output, a current mirror circuit 212 connected electrically to the voltage-to-current converting unit 211 for generating a bias current output according to the current output from the voltage-to-current converting unit 211, and a delay unit 213 connected electrically to the current mirror circuit 212 for generating the output clock according to the bias current output from the current mirror circuit 212.

In the first embodiment of the voltage controlled oscillator 21, the voltage-to-current converting unit 211 includes a seventh NMOS transistor (MN7), and a second variable resistor unit (VR2) composed of a third resistor (R3), N fourth resistors (R4$_0$~R4$_{N-1}$) and N fifteenth switches (S5$_0$~S15$_{N-1}$). The seventh NMOS transistor (MN7) has a gate for receiving the control voltage signal from the loop filter 27, a source connected electrically to one end of the third resistor (R3) and first ends of the fifteenth switches ($S15_0$~$S15_{N-1}$), and a drain. A second end of each of the fifteenth switches ($S15_0$~$S15_{N-1}$) is connected electrically to one end of a corresponding one of the fourth resistors ($R4_0$~$R4_{N-1}$). Each of the third resistor (R3) and the fourth resistor ($R4_0$~$R4_{N-1}$) has the other grounded end. It is assumed that the resistors (R3), ($R4_0$~$R4_{N-1}$) have the same resistance. The switching operation of the fifteenth switches ($S15_0$~$S15_{N-1}$) is controlled by the control signal F[0]F[N−1] from the controller 29 such that the higher the frequency of the input data, the larger will be the number of the fourth resistors ($R4_0$~$R4_{N-1}$) connected in parallel to the third resistor (R3), thereby resulting in a smaller resistance of the second variable resistor unit (VR2). The current mirror circuit 212 includes a seventh PMOS transistor (MP7) and three eighth PMOS transistors ($MP8_0$~$MP8_2$). Sources of the PMOS transistors (MP7), ($MP8_0$~$MP8_2$) are adapted to be connected electrically to a DC voltage source (not shown). Drain and gate of the seventh PMOS transistor (MP7), and gates of the eighth PMOS transistors ($MP8_0$~$MP8_2$) are connected electrically to the drain of the seventh NMOS transistor (MN7). It is assumed that the PMOS transistors (MP7), ($MP8_0$~$MP8_2$) have the same size. Therefore, each of the eighth PMOS transistors ($MP8_0$~$MP8_2$) generates a bias current at the drain thereof equal to the voltage of the control voltage signal minus the threshold voltage of the seventh NMOS transistor (MN7), all divided by the resistance of the second variable resistor unit (VR2). The bias currents generated from the eighth PMOS transistors ($MP8_0$~$MP8_2$) constitute the bias current output. As such, the bias current output from the first current mirror circuit 212 is inversely proportional to the resistance of the second variable resistor unit (VR2), and is proportional to the frequency of the input data. The delay unit 213 includes three ring-cascaded delay components ($D_0$~$D_2$), and three capacitors ($C_0$~$C_2$) each connected electrically between an adjacent pair of the delay components ($D_0$~$D_2$) The bias current from each of the eighth PMOS transistors ($MP8_0$~$MP8_2$) is supplied to a corresponding one of the delay components ($D_0$~$D_2$) to decide delay time. Each of the delay components ($D_0$~$D_2$) and the three capacitors ($C_0$~$C_2$) has a grounded end. The delay component ($D_2$) outputs the output clock.

Since the gain of the voltage controlled oscillator 21 is proportional to the bias current output from the current mirror circuit 212, and is inverse-proportional to the capacitance of the capacitors ($C_0$~$C_2$), and since the bias current output from the current mirror circuit 212 is proportional to the frequency of the input data, the gain of the voltage controlled oscillator 21 is proportional to the frequency of the input data, thereby dynamically adjusting the loop bandwidth with change in the frequency of the input data.

It is noted that the numbers of the eighth PMOS transistor, the delay components, and the capacitors are vary according to design requirements and should not be limited to those shown in FIG. 10.

Figure 11:
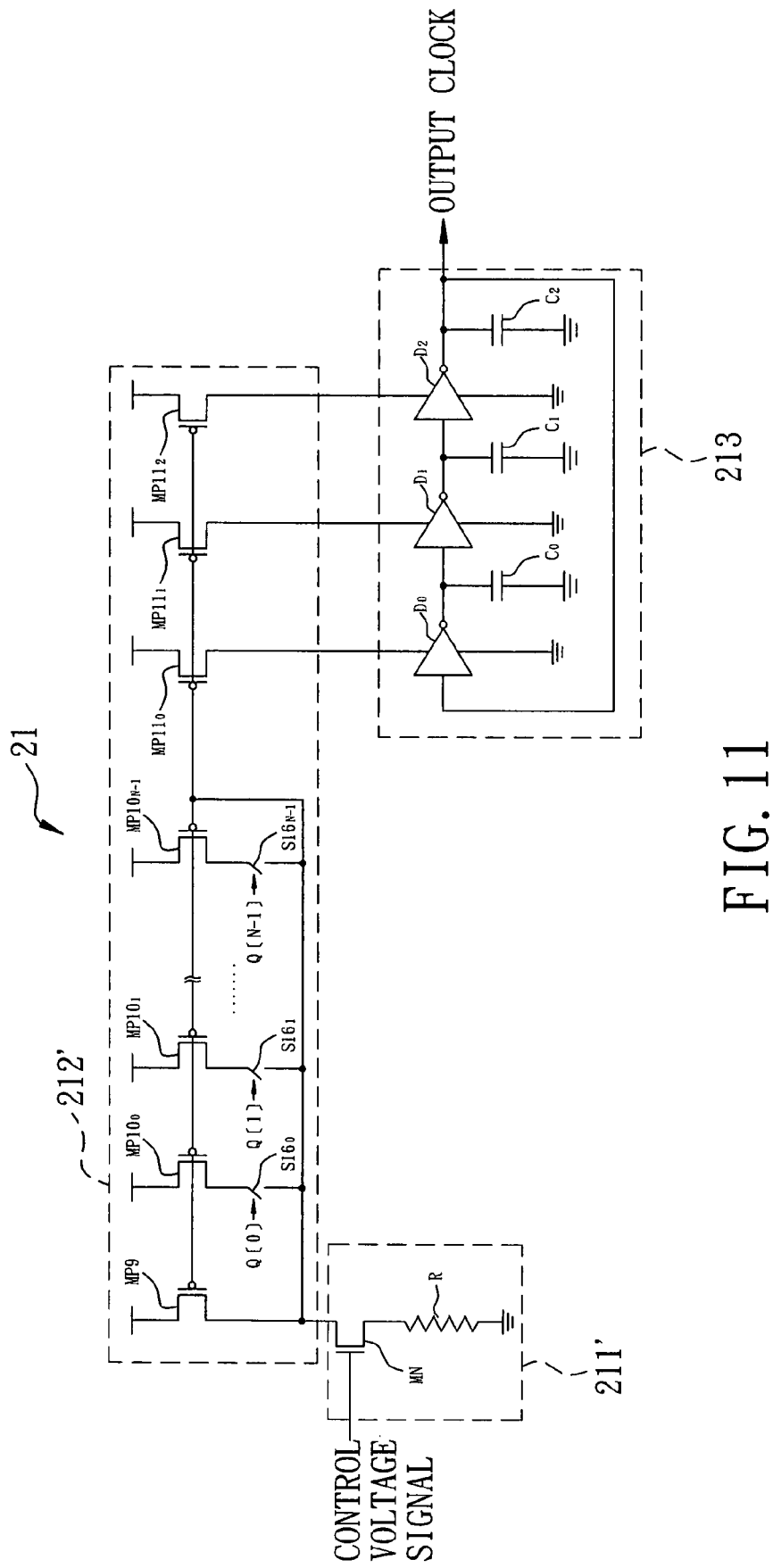
FIG. 11 is a schematic electrical circuit diagram showing a second embodiment of the voltage controlled oscillator of the first preferred embodiment.

FIG. 11 illustrates a second embodiment of the voltage controlled oscillator 21, which is a modification of the first embodiment of the voltage controlled oscillator 21 of FIG. 10. Unlike the first embodiment of the voltage controlled oscillator 21 of FIG. 10, the voltage-to-current converting unit 211' includes an NMOS transistor (MN) having a gate for receiving the control voltage signal from the loop filter 27, and a resistor (R) connected electrically between a source of the NMOS transistor (MN) and ground. The current mirror circuit 212' includes a ninth PMOS transistor MP9, N tenth PMOS transistors ($MP10_0$~$MP10_{N-1}$) three eleventh PMOS transistors ($MP10_0$~$MP11_{N-1}$) and N sixteenth switches ($S16_0$~$S16_{N-1}$). It is assumed that the PMOS transistors (MP9), ($MP10_0$~$MP10_{N-1}$), ($MP11_0$~$MP11_2$) have the same size. Sources of the PMOS transistors (MP9), ($MP10_0$~$MP10_{N-1}$), ($MP11_0$~$MP11_3$) are adapted to be connected electrically to a DC voltage source (not shown). Gates of the PMOS transistors (MP9) ($MP10_0$~$MP10_{N-1}$), ($MP11_0$~$MP11_2$), a drain of the ninth PMOS transistor (MP9) and first ends of the sixteenth switches ($S16_0$~$S16_{N-1}$) are connected electrically to a drain of the NMOS transistor (MN) of the voltage-to-current converting unit 211'. Second ends of the sixteenth switches ($S16_0$~$S16_{N-1}$) are connected electrically and respectively to drains of the tenth PMOS transistors ($MP10_0$~$MP10_{N-1}$). Drains of the eleventh PMOS transistors ($MP11_0$~$MP11_2$) are connected electrically respectively to the delay components ($D_0$~$D_2$) of the delay unit 213.

It is noted that the switching operation of the sixteenth switches ($S16_0$~$S16_{N-1}$) is controlled by the output Q[0] Q[N−1] from the controller 29 such that the greater the run length, the greater will be the number of the tenth PMOS transistors ($MP10_0$~$MP10_{N-1}$) connected in parallel to the ninth PMOS transistor (MP9), thereby resulting in the smaller bias current output from the current mirror circuit 212' because the bias current from each of the eleventh PMOS transistors ($MP11_0$~$MP11_2$) is equal to the voltage of the control voltage signal minus the threshold voltage of the NMOS transistor (MN), all divided by a product of the resistance of the resistor (R) of the voltage-to-current converting unit 211' and the run length. Since the gain of the voltage controlled oscillator 21 is proportional to the bias current output from the current mirror circuit 212', and since the bias current output from the current mirror circuit 212' is inversely proportional to the run length, the gain of the voltage controlled oscillator 21 is proportional to the frequency of the input data, thereby dynamically adjusting the loop bandwidth with change in the frequency of the input data.

It is noted that the number of the eleventh PMOS transistors, and those of the delay components and the capacitors of the delay unit 213 can vary according to design requirements and should not be limited to those shown in FIG. 11.

Figure 12:
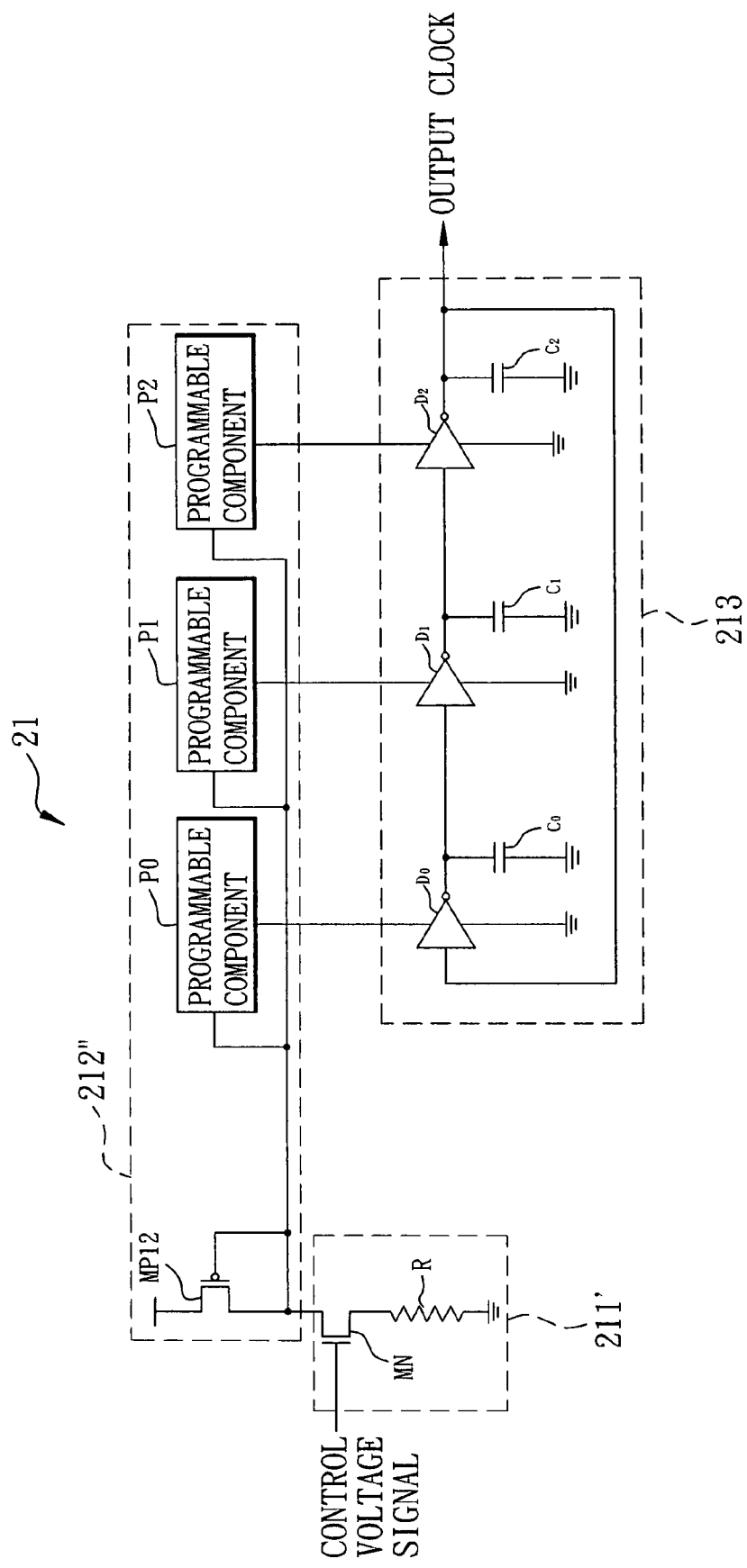
FIG. 12 is a schematic electrical circuit diagram showing a third embodiment of the voltage controlled oscillator of the first preferred embodiment.
Figure 13:
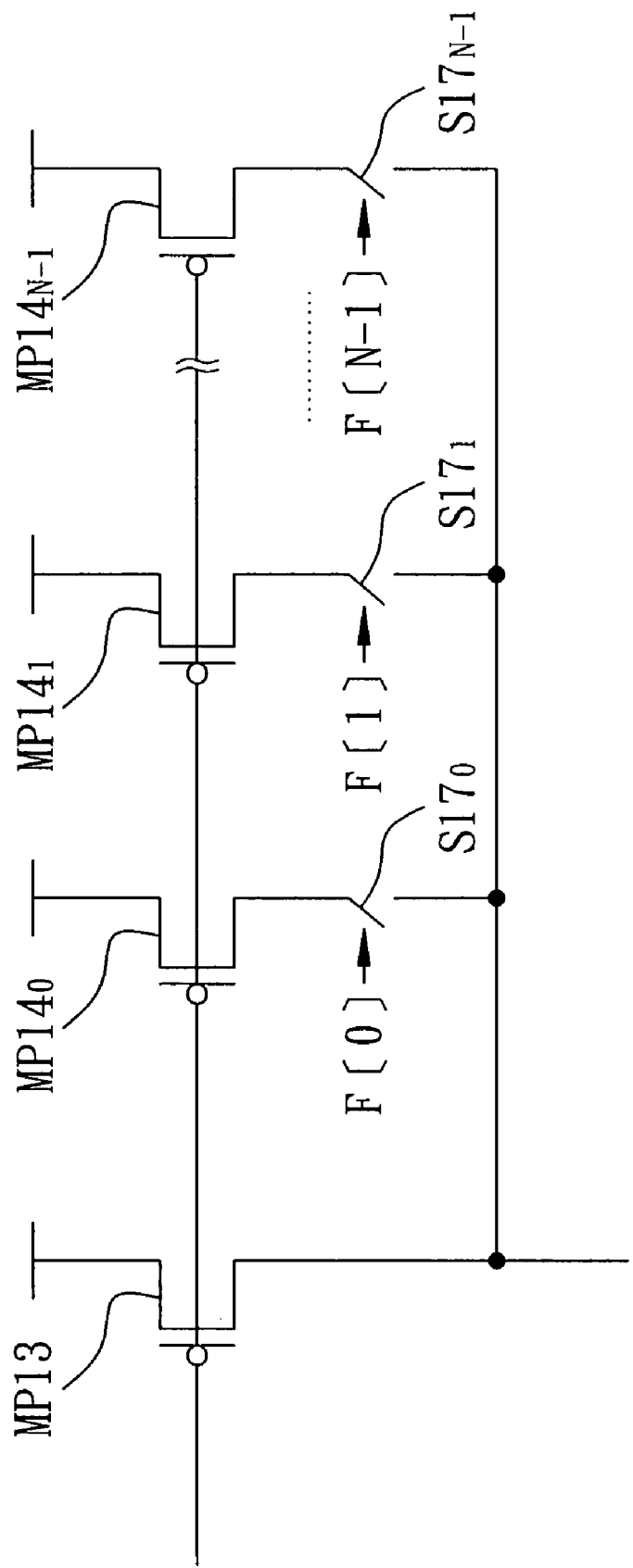
FIG. 13 is a schematic electrical circuit diagram showing a programmable component of the third embodiment of the voltage controlled oscillator of FIG. 12.

FIGS. 12 and 13 illustrate a third embodiment of the voltage controlled oscillator 21, which is a modification of the second embodiment of the voltage controlled oscillator 21 of FIG. 11. Unlike the second embodiment of the voltage controlled oscillator 21 of FIG. 11, the current mirror circuit 212" includes a twelfth PMOS transistor (MP12) and three programmable components (P0~P2). The bias current output includes three bias currents generated respectively by the programmable components (P0~P2). As shown in FIG. 13, each of the programmable components (P0~P2) includes a thirteenth PMOS transistor (MP13), N fourteenth PMOS transistors ($MP14_0$~$MP14_{N-1}$) and N seventeenth switches ($S17_0$~$S17_{N-1}$). It is assumed that the PMOS transistors (MP12, MP13), ($MP14_0$~$MP14_{N-1}$) have the same size. For each of the programmable components (P0~P2), sources of the PMOS transistors (MP13), ($MP14_0$~$MP14_{N-1}$) are adapted to be connected electrically to a DC voltage source (not shown). Gates of the PMOS transistors (MP13), ($MP14_0$~$MP14_{N-1}$) and the drain and gate of the twelfth PMOS transistor (MP12) are connected electrically to the drain of the PMOS transistor (MN) of the voltage-to-current converting unit 211'. First ends of the seventeenth switches ($S17_0$~$S17_{N-1}$) are connected electrically and respectively to drains of the fourteenth PMOS transistors ($MP14_0$~$MP14_{N-1}$). A drain of the thirteenth PMOS transistor (MP13) and second ends of the seventeenth switches ($S17_0$~$S17_{N-1}$) are connected electrically to a corresponding one of the delay components ($D_0$~$D_2$) of the delay unit 213.

It is noted that the switching operation of the seventeenth switches ($S17_0$~$S17_{N-1}$) is controlled by the control signal F[0]~F[N−1] from the controller 29 such that the greater the frequency of the input data, the greater will be the number of the fourteenth PMOS transistors ($MP14_0$~$MP14_{N-1}$) connected in parallel to the thirteenth PMOS transistor (MP13), thereby resulting in the greater bias current from each of the programmable components (P0~P2). Since the gain of the voltage controlled oscillator 21 is proportional to the bias current output from the current mirror circuit 212″, the gain of the voltage controlled oscillator 21 is proportional to the frequency of the input data, thereby dynamically adjusting the loop bandwidth with change in the frequency of the input data.

It is noted that the number of the programmable components and those of the delay components and the capacitors of the delay unit can vary according to design requirements and should not be limited to those shown in FIG. 12.

Figure 14:
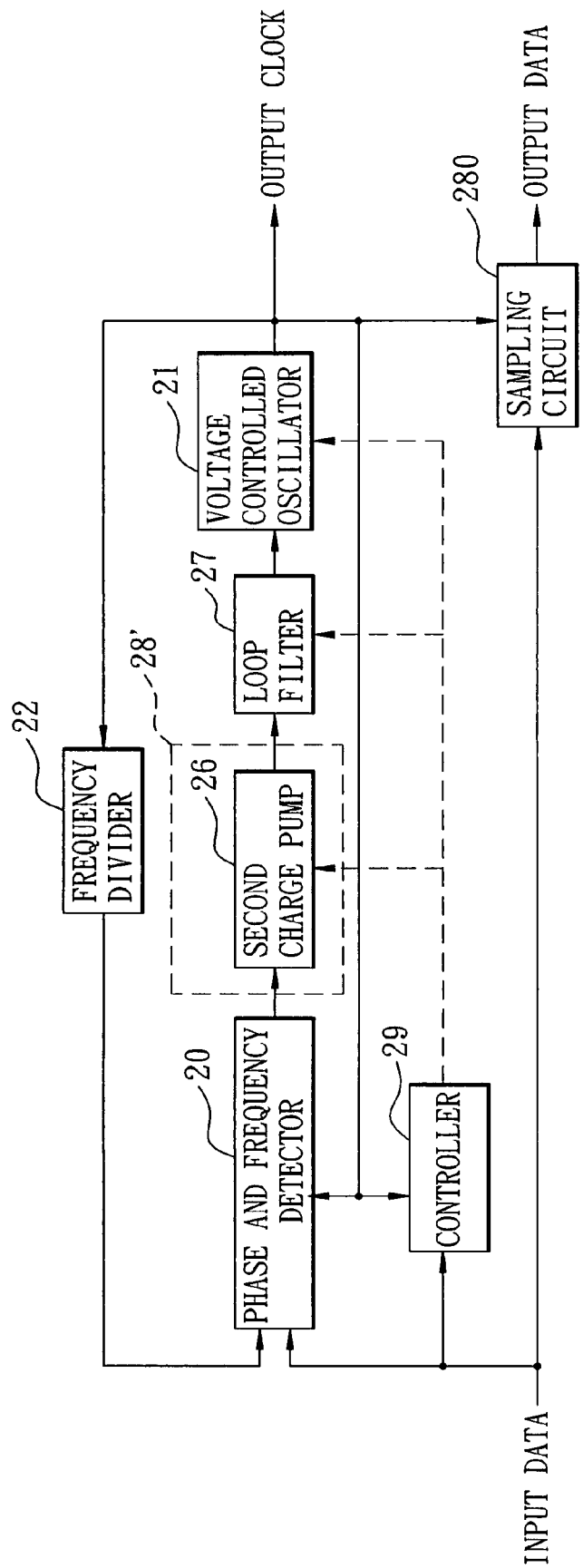
FIG. 14 is a schematic circuit block diagram showing the second preferred embodiment of a clock and data recovery circuit according to the present invention.

FIG. 14 illustrates the second preferred embodiment of a clock and data recovery circuit according to this invention, which is a modification of the first preferred embodiment. In this embodiment, the charge pump unit 28' merely has the second charge pump 26. The clock and data recovery circuit includes a phase and frequency detector 20, instead of the frequency detector 23 and the phase detector 25 in the first preferred embodiment of FIG. 2, connected electrically to voltage controlled oscillator 21, the charge pump unit 28', the frequency divider 22 and the controller 29 for comparing the frequency-divided output clock from the frequency divider 22 with the input data and for outputting the error signal according to phase and frequency difference therebetween.

It is noted that the frequency divider 22 is an optional component in the first and second preferred embodiments. When the frequency divider 22 is omitted, the output clock from the voltage controlled oscillator 21 is compared directly with the input data for generating the error signal.

In sum, at least one of the second current output outputted by the second charge pump 26, the impedance of the loop filter 27, and the gain of the voltage controlled oscillator 21 can be controlled by the controller 29 according to the run length corresponding to the input data. Therefore, the loop bandwidth can be dynamically adjusted with change in the frequency of the input data.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A clock and data recovery circuit comprising:
a voltage controlled oscillator for generating an output clock according to a control voltage signal;
a loop filter connected electrically to said voltage controlled oscillator for outputting the control voltage signal according to a current output;
a charge pump unit connected electrically to said loop filter for outputting the current output according to an error signal; and
a controller connected electrically to said voltage controlled oscillator for determining a run length corresponding to input data based on the output clock from said voltage controlled oscillator, said controller further controlling at least one of said voltage controlled oscillator, said loop filter and said charge pump unit according to the run length to dynamically adjust loop bandwidth;
wherein said controller includes an inverse coder connected electrically to at least one of said voltage controlled oscillator and said charge pump unit for generating a control signal, which has a frequency proportional to that of the input data, based on the run length, said controller further controlling at least one of said voltage controlled oscillator and said charge pump unit based on the control signal.

2. The clock and data recovery circuit as claimed in claim 1, wherein said charge pump unit includes a current source unit, and a capacitor unit disposed between said current source unit and said loop filter, said capacitor unit including a plurality of capacitors, said controller controlling said charge pump unit such that the number of said capacitors connected in parallel between said current source unit and said loop filter corresponds to the run length.

3. The clock and data recovery circuit as claimed in claim 2, wherein the greater the run length, the larger will be the number of said capacitors connected in parallel between said current source unit and said loop filter.

4. The clock and data recovery circuit as claimed in claim 3, wherein said current source unit controls charging and discharging of said capacitors based on the error signal.

5. The clock and data recovery circuit as claimed in claim 1, wherein said charge pump unit includes a current source, and a current mirror circuit connected electrically to said current source for receiving a current from said current source and for outputting the current output, said controller controlling said charge pump unit according to the run length such that the greater the run length, the less will be the current output.

6. The clock and data recovery circuit as claimed in claim 5, wherein said current mirror circuit includes a plurality of transistors, said controller controlling said charge pump unit such that the number of said transistors connected in parallel between said current source and said loop filter corresponds to the run length.

7. The clock and data recovery circuit as claimed in claim 1, wherein said loop filter includes a variable resistor unit, said controller controlling said variable resistor unit such that resistance of said variable resistor unit corresponds to the run length.

8. The clock and data recovery circuit as claimed in claim 7, wherein said loop filter further includes a first capacitor connected in series to said variable resistor unit, and a second capacitor connected in parallel to a series connection of said variable resistor unit and said first capacitor.

9. The clock and data recovery circuit as claimed in claim 7, wherein said variable resistor unit includes a plurality of resistors, said controller controlling said variable resistor unit such that the number of said resistors connected in parallel to each other corresponds to the run length, in which the greater the run length, the larger will be the number of said resistors that are connected in parallel to each other.

10. The clock and data recovery circuit as claimed in claim 1, wherein said controller controls said voltage controlled oscillator such that a gain of said voltage controlled oscillator corresponds to the run length, in which the greater the run length, the smaller will be the gain of said voltage controlled oscillator.

11. The clock and data recovery circuit as claimed in claim 10, wherein said voltage controlled oscillator includes:
   a voltage-to-current converting unit for converting the control voltage signal from said loop filter into a current output;
   a current mirror circuit connected electrically to said voltage-to-current converting unit for generating a bias current output according to the current output from said voltage-to-current converting unit; and
   a delay unit connected electrically to said current mirror circuit for generating the output clock according to the bias current output from said current mirror circuit.

12. The clock and data recovery circuit as claimed in claim 11, wherein said controller controls said voltage controlled oscillator such that the bias current output corresponds to the run length, in which the greater the run length, the less will be the bias current output.

13. The clock and data recovery circuit as claimed in claim 11, wherein the bias current output from said current mirror circuit is proportional to the gain of said voltage controlled oscillator.

14. The clock and data recovery circuit as claimed in claim 11, wherein said voltage-to-current converting unit includes a variable resistor unit, said controller controlling said variable resistor unit such that resistance of said variable resistor unit corresponds to the run length.

15. The clock and data recovery circuit as claimed in claim 14, wherein said variable resistor unit includes a plurality of resistors, said controller controlling said variable resistor unit such that the number of said resistors connected in parallel to each other corresponds to the run length, in which the greater the run length, the less will be the number of said resistors connected in parallel to each other.

16. The clock and data recovery circuit as claimed in claim 11, wherein said current mirror circuit includes a plurality of programmable components, the bias current output including a plurality of bias currents generated respectively by said programmable components, the bias current generated by each of said programmable components being based on the run length from said controller.

17. The clock and data recovery circuit as claimed in claim 16, wherein the greater the run length, the less will be the bias current generated by each of said programmable components.

18. The clock and data recovery circuit as claimed in claim 17, wherein each of said programmable components includes a plurality of transistors, said controller controlling each of said programmable components such that the number of said transistors thereof connected in parallel to each other corresponds to the run length.

19. The clock and data recovery circuit as claimed in claim 18, wherein the greater the run length, the less will be the number of said transistors of each of said programmable components that are connected in parallel to each other.

20. A method of adjusting loop bandwidth of a clock and data recovery circuit, the clock and data recovery circuit receiving input data and outputting output data corresponding to the input data in response to an output clock generated thereby, the clock and data recovery circuit including a voltage controlled oscillator, a loop filter, and a charge pump unit, said method comprising the steps of:
   determining a run length of the input data; and
   controlling at least one of the voltage controlled oscillator, the loop filter and the charge pump unit according to the run length to dynamically adjust the loop bandwidth;
   wherein the run length is encoded into one of a binary-code signal and a thermometer-code signal, said one of the binary-code signal and the thermometer-code signal being further encoded into a control signal by an inverse coder such that the control signal has a frequency proportional to that of the input data, said at least one of the voltage controlled oscillator, the loop filter and the charge pump unit being controlled through the control signal.

21. The method as claimed in claim 20, wherein the run length of the input data is obtained through a counter, the counter being reset when the input data changes.

22. The method as claimed in claim 20, wherein the run length of the input data is obtained through an N-stage shift register unit, the N-stage shift register unit being reset when the input data changes.

23. The method as claimed in claim 22, wherein N is a maximum value of the run length.

* * * * *